United States Patent
Yang

(10) Patent No.: US 7,540,503 B2
(45) Date of Patent: Jun. 2, 2009

(54) VACUUM HOLDER FOR INTEGRATED CIRCUIT UNITS

(75) Inventor: Hae Choon Yang, Singapore (SG)

(73) Assignee: Rokko Systems Pte Ltd., Singapore (SG)

( * ) Notice: Subject to any disclaimer, the term of this patent is extended or adjusted under 35 U.S.C. 154(b) by 151 days.

(21) Appl. No.: 11/662,283

(22) PCT Filed: Jul. 19, 2005

(86) PCT No.: PCT/SG2005/000240

§ 371 (c)(1), (2), (4) Date: Mar. 9, 2007

(87) PCT Pub. No.: WO2006/036126

PCT Pub. Date: Apr. 6, 2006

(65) Prior Publication Data

US 2008/0118997 A1    May 22, 2008

(51) Int. Cl.
*B23B 31/30* (2006.01)
(52) U.S. Cl. .......................................... 279/3
(58) Field of Classification Search ................. 279/3
See application file for complete search history.

(56) References Cited

U.S. PATENT DOCUMENTS

| 5,374,829 A | * | 12/1994 | Sakamoto et al. ...... 250/453.11 |
| 5,882,055 A | | 3/1999 | Smith |
| 5,953,590 A | | 9/1999 | Piper et al. |
| 6,196,532 B1 | | 3/2001 | Otwell |

FOREIGN PATENT DOCUMENTS

EP    0 456 426    11/1991

* cited by examiner

*Primary Examiner*—Evan Pert
(74) *Attorney, Agent, or Firm*—Dickstein Shapiro LLP

(57) ABSTRACT

A support device for supporting a set of integrated circuit units (65), the device comprising: a support member having a metal surface, said surface having an array of recesses (27); a soft material layer, overlaying the recesses of the metal surface so as to protect the units (65) from damage caused by contact with the metal surface, and; a vacuum means (35) in communication with said recesses (27), such that the vacuum means supports each unit within a respective recess, wherein the soft material layer is formed of a plurality of independent inserts (40), each insert engageable with at least one recess using engagement means (50, 55) for engaging each insert (40) with the at least one recess (27).

10 Claims, 2 Drawing Sheets

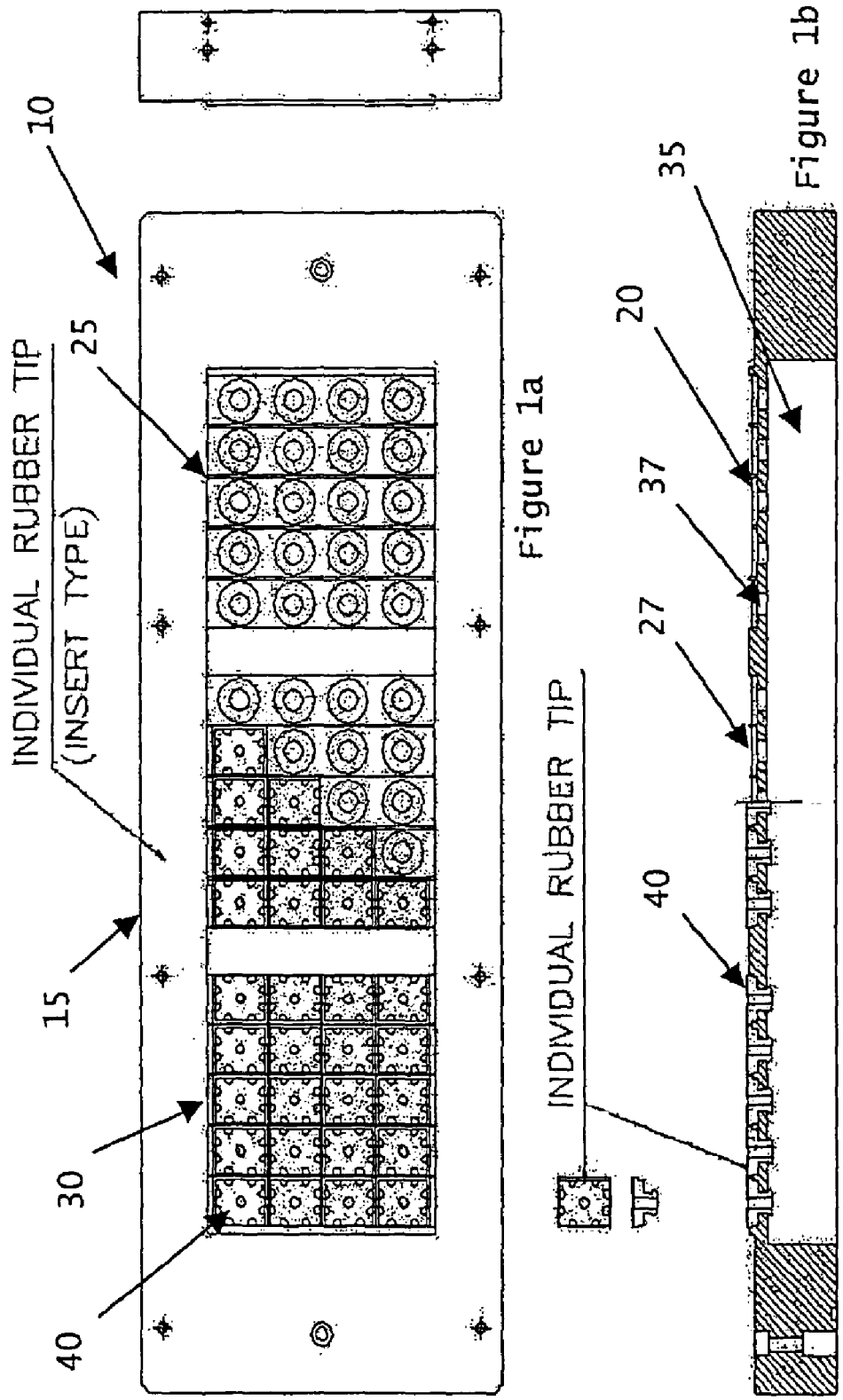

VACUUM HOLDER FOR INTEGRATED CIRCUIT UNITS

FIELD OF THE INVENTION

The present invention relates to a sawing and sorting system. The system interacts with, or includes, a dicing machine which saws ("dices") a substrate with many integrated circuits formed onto it to form individual integrated circuits. The invention further relates to apparatus for use in such a sawing and sorting system.

BACKGROUND OF THE INVENTION

Conventionally a plurality of integrated circuits are formed simultaneously on a semiconductor substrate, and the substrate is then diced to form individual integrated circuits. Apparatus is know for feeding substrates into such a dicing machine, and for sorting the diced integrated circuits.

One type of integrated circuit which is becoming increasingly popular is one having an array of multiple electrical contacts (typically solder balls, known as a ball grid array (BGA) packages, and pads in non-leaded packages, known as a Quad Flatpack Non-Leaded (QFN) packages) in an array on one of its major faces. The dicing of a substrate having a ball grid array on one of its surfaces is typically performed with the surface of the substrate carrying the balls facing upwards. It is known to perform a limited number of sorting operations on the singulated integrated circuit units to detect abnormal (faulty) units. At each stage of the process following singulation of the integrated circuit units, the manipulation of the units requires a firm engagement of the units. In some circumstances this is achieved a vacuum seal whereby the unit is held within a matrix by suction. In one arrangement a metal "manifold" having an internal hollow portion which is applied a vacuum will have a surface divided into an array of recesses with an aperture for each recess through which the vacuum will draw the units.

The units themselves are delicate and can suffer damage through the manipulation process and particularly, when draw near to the respective metal recesses of the surface. For this reason, a layer or coating of a soft material such as rubber is placed on the surface such that the unit contacts the soft layer rather than the metal surface.

Because of the fine tolerances required for holding the small units it is a particularly complex task to bond the layer to the metal surface. One difficulty in this duplication process is the different tolerances required of the metal surface as compared to the soft material. Therefore, the element having the metal surface with the layer and the vacuum manifold are generally expensive items should themselves need to be treated with care.

As a result of the manufacturing process, it is inevitable that the soft material layer will either wear or suffer damage. To prevent damage to the units, it is therefore necessary to replace the soft material layer. However, because of the aforementioned difficulties replacing the soft metal layer will also require replacement of the entire element.

It is therefore an object of the present invention to reduce the cost of replacement imposed by wear or damage.

SUMMARY OF THE INVENTION

In light of the object, the invention provides a support device for supporting a set of integrated circuit units, the device comprising:

a support member having a metal surface, said surface having an array of recesses;

a soft material layer, overlaying the recesses of the metal surface so as to protect the units from damage caused by contact with the metal surface, and;

a vacuum means in communication with said recesses, such that the vacuum means supports each unit within a respective recess, wherein the soft material layer is formed of a plurality of independent inserts, each insert engageable with at least one recess.

Therefore, the invention provides for replaceable inserts which will fit into the metal surface and so on damage to the soft material formed by the plurality of inserts instead of replacing the entire element including the undamaged metal surface, it is only necessary to replace those particular inserts that have suffered wear or damage.

A further advantage of the present invention beyond the cost saving of replacing the entire element is the manufacturing cost. As discussed creating a layered element of dissimilar materials being the soft material such as rubber and the metal surface is a difficult and potentially expensive exercise. Further, avoiding delamination of the layer in use is a further problem to be overcome. In one embodiment of the present invention, this is overcome through a mechanical engagement between the insert and the metal surface. Alternatively, the inserts may be chemically bonded to the metal surface. Thus, manufacturing of the element as a whole avoids the layering process required of the prior art and instead applies simply on either a mechanical of chemical bonding of the insert to the surface which may require little expertise or cost.

In a preferred embodiment, mechanically engageable inserts may have a barbed portion which may engage with an internal shape of a portion of the recess, such that, on application of a force to the insert, the insert is "press fit" into the recess through a corresponding engagement of the insert barbed portion and internal shaped portion of the recess.

In an alternative embodiment, the insert may be bonded to the metal surface, which may be sufficient to hold the insert, but permitting selective removal of the insert through heat, force or a combination of both. Such a bond may be through a "hot melt" material which may be applied in a hot liquid form and sets at room temperature.

In one embodiment, each recess may be engaged with a single recess. Alternatively, or in certain circumstances, as well as, a single insert may overlay several recesses, and either engage with each recess, or sufficient recesses to maintain engagement. In a purely illustrative, and non-limiting, example, one insert may overlay eight recesses, and engage with only four peripherally located recesses.

Further to the manufacturing advantages because of the dissimilar inherent tolerances of a soft material and metal having the layer covering many of the recesses, any inconsistency in the tolerances between individual recesses and the layer will be multiplied by the number of recesses present in the metal surface. In the present invention, however, any inconsistency in tolerance will apply to individual recesses or in a preferred embodiment, a small number of recesses for a multiple recess insert and thus, limiting any multiplication of the inconsistency.

Further advantages to the present invention relates to a balance between downtime of the equipment and the cost of spare parts. To limit the lost production time through replacing an element, a fabricator may keep in stock several replacement elements of the prior art. Such spare equipment may include a Twin Chuck Table, Net lifter, Frame lifter and Idle lifter, each of which may require the use of the support device of the prior art. To this end, being expensive items, the fabricator will need to bear the cost of the non-productive spare equipment. Alternatively, the present invention may require maintaining a stock of inserts only, applicable for use with each of the above equipment. Being relatively inexpensive items the fabricator may maintain this stock at a lower cost without compromising lost production time.

In a further benefit the time taken to replace the element of the prior art will be substantial, as this may require the refit of a new element, alignment of vacuum seals etc. This is compared to fitting the required inserts to the metal surface which may be a fraction of the downtime and maintenance cost compared to the prior art.

In a preferred embodiment, the inserts may be entirely made of the soft material, said material including, but not limited to polyurethane, natural rubber and silicone. It will be apparent to the skilled person that other available relevant materials may also perform the protective function of the invention, and so the invention is not limited to the above materials, but will include each of said relevant materials.

In a more preferred embodiment, the insert may comprise more than one material. A material may be selected based on the particular function of differing portions of the insert. For instance, the engagement means of the insert may be of a different material to contact surface of the insert. The contact surface is that portion which contacts and protects the units, and so is well suited to the soft material. However, an engagement portion, corresponding to the engagement means may be of a stiffer material to facilitate mechanical engagement. As an illustrative, non-limiting, example, a suitable material may include polypropylene, HDPE, ABS etc.

Further, if the engagement means includes a chemical engagement, the engagement portion of the insert may include a material that suits the type of chemical engagement.

In a further embodiment, the selection of multiple materials for the insert may also take into account the compatibility of the various selections so as to both serve their respective functions, and also facilitate efficient and effective manufacture.

BRIEF DESCRIPTION OF DRAWINGS

It will be convenient to further describe the present invention with respect to the accompanying drawings which illustrate possible arrangements of the invention. Other arrangements of the invention are possible, and consequently the particularity of the accompanying drawings is not to be understood as superseding the generality of the preceding description of the invention.

FIG. 1a is a plan view of a support device according to the present invention;

FIG. 1b is a side elevation view of the support device of FIG. 1a;

FIG. 2b is a side elevation view of the soft material layer of FIG. 2a.

FIGS. 1a and 1b show a support device 10 such as a vacuum pad for use with Twin Chuck Table, Net lifter, Frame lifter and Idle lifter. Said devices are used to manipulate and support units, such as integrated circuit chips singulated from a wafer.

Figure 2A:
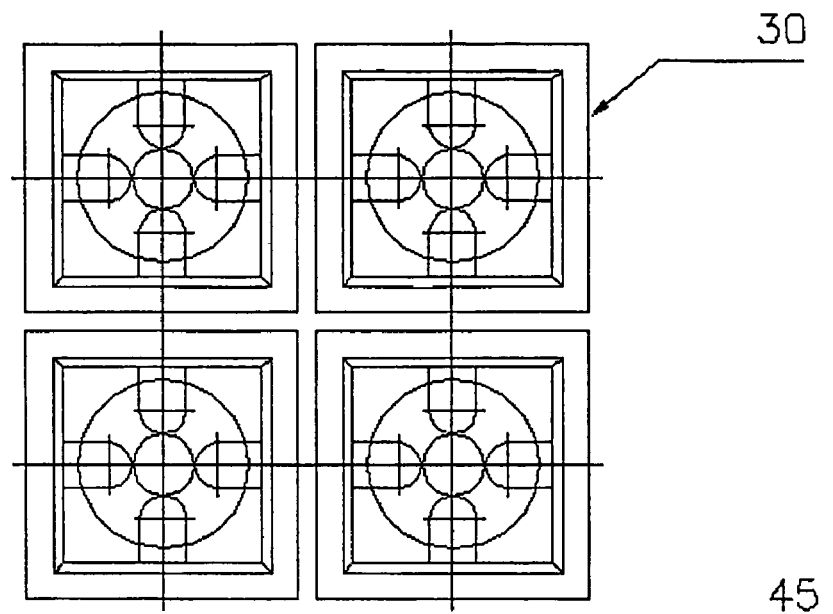
FIG. 2a is a detail view of the soft material layer of the support device according to the present invention.

The support device 10 includes a support member 15 which acts as a housing for a metal surface 20, a "manifold" chamber 35 for a applying a vacuum and an overlay 30. The metal surface includes an array 25 of recesses 27 which correspond to the inserts 40 to which the support device 10 allocates and supports the units. Because of the metal surface representing a hazard to the units, the overlay 30 cushions the effect of the units coming in contact with the support device 10. In the prior art, this overlay is formed of a sheet of rubber. The present invention, however, provides a layer of individual inserts which, together form a layer, but individually, correspond to one or a small number of the recesses 27.

In this embodiment, each insert 40 corresponds to a single recess 27, and thus forms a mosaic of inserts which form the layer 30.

Figure 2B:
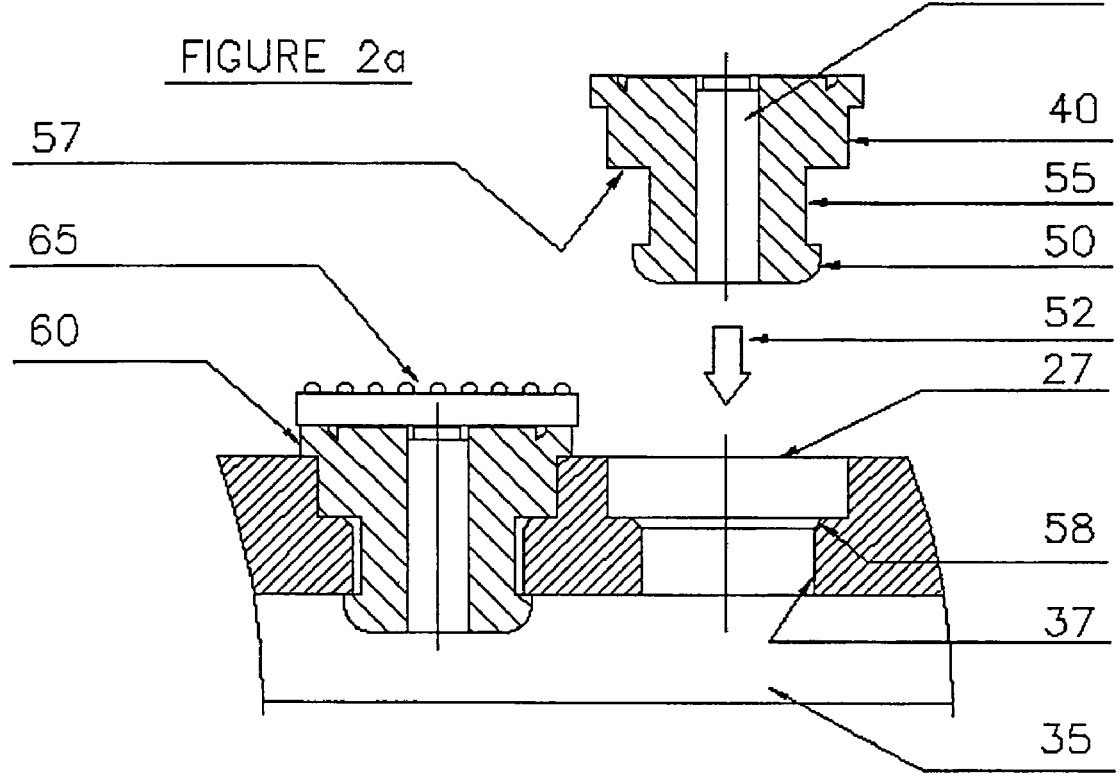

FIGS. 2a and 2b show a close up view of the arrangement of inserts 40 and recesses 27. The inserts form, in this embodiment, a tessellated layer of soft material, corresponding to the array of recesses. Each insert 40 includes a barbed portion 50 and an engagement portion 55. To engagement the insert with the recess 27, a force is applied to the top of the insert 60, pressing the barb 50 into the recess, and passed a throat 37 of the recess. the throat 37 is of a smaller corresponding size to the recess 27 itself, with the throat being of a size to require the barb 50 to deform so as to pass through. Once the barb 50 is clear of the throat, the throat then engages in a relaxed fit with the engagement portion 55 of the insert. Thus, in this embodiment, the insert is engaged with the recess through a press fit 52, with the insert, on engagement, sitting in an unstressed condition. In a preferred embodiment, the insert may sit "snuggly" with a shoulder portion 57 of the insert contacting the interface 58 between the recess 27 and the throat 37, with this contact acting as a "stop" to both position the insert 40, and prevent over application of force.

When supported by the support device 10, the unit 65 is held in place by a vacuum. The vacuum in this embodiment, is generated by a negative pressure with the manifold chamber 35, with this chamber being in fluid communication with the unit 65 through a conduit 45 passing through the insert 40. Thus, in this embodiment, the conduit may be a centrally located conduit 45, passing through the center of the insert 40, so as to maintain the corresponding unit in a central position in contact with the overlay portion of the insert.

The invention claimed is:

1. A support device for supporting a set of integrated circuit units, the device comprising:
   a support member having a metal surface, said surface having an array of recesses; a soft material layer, overlaying the recesses of the metal surface so as to protect the units from damage caused by contact with the metal surface, and; a vacuum means in communication with said recesses, such that the vacuum means supports each unit within a respective recess, wherein
   the soft material layer is formed of a plurality of independent inserts, each insert engageable with at least one recess, using engagement means for engaging each insert with the at least one recess.

2. The support device according to claim 1 wherein the engagement means includes one or both of mechanical engagement and chemical bonding engagement.

3. The support device according to claim 2 wherein the mechanical engagement includes a press fitting between the insert and at least one recess.

4. The support device according to claim 1 wherein each insert is engageable with a single recess.

5. The support device according to claim 1 wherein the insert is engageable with at least two recesses.

6. The support device according to claim 1 wherein the soft material is one or a combination of natural rubber, polyurethane or silicone.

7. The support device according to claim 1 wherein the inserts include a second stiff material bonded to the soft material for facilitating the engagement means.

8. The support device according to claim 1 wherein the vacuum means includes a vacuum pump in communication with the support member for creating a negative pressure within an internal chamber of the support member, such that each recess, and each portion of the insert corresponding to each recess, includes an aperture through which the negative pressure acts so as to draw in and engage with a unit corresponding to the recess.

9. A support device, using independent inserts, said supporting device for supporting a set of integrated circuit units, the device comprising:
   a support member having the metal surface, said surface having an array of recesses;
   a soft material layer, overlaying the recesses of the metal surface so as to protect the units from damage caused by contact with the metal surface, and;
   a vacuum means in communication with said recesses, such that the vacuum means supports each unit within a respective recess, wherein
   the soft material layer is formed of a plurality of the independent inserts, each insert engageable with at least one recess.

10. A method of repairing a support device, said support device used to support a set of integrated circuit units, the method comprising the steps of:
   removing a damaged or worn insert from a recess of a support member of the support device, said support member having a metal surface with an array of said recesses; selecting a replacement insert for re-engagement with the recess;
   engaging the insert with the recess, so as to permit a vacuum means in communication with said recesses to support a unit within the respective recess, wherein
   the replacement insert completes a soft material layer on the metal surface, said layer comprising a plurality of independent inserts.

* * * * *